United States Patent [19]
Noguchi

[11] Patent Number: 5,608,355
[45] Date of Patent: Mar. 4, 1997

[54] AUTOMATIC ADJUSTMENT CIRCUIT FOR AN OSCILLATOR

[75] Inventor: Yasunori Noguchi, Kyoto, Japan

[73] Assignee: Rohm Co., Ltd., Kyoto, Japan

[21] Appl. No.: 638,507

[22] Filed: Apr. 26, 1996

[30] Foreign Application Priority Data

Apr. 28, 1995 [JP] Japan ................................ 7-105958

[51] Int. Cl.⁶ ........................................................ H03L 7/00
[52] U.S. Cl. ............................... 331/1 A; 331/2; 331/4; 331/20; 331/DIG. 2; 327/145; 327/146; 327/151; 327/155; 327/160; 360/51
[58] Field of Search ............................. 331/1 A, 2, 4, 331/14, 17, 18, 20, 25, DIG. 2; 327/145–151, 155–160; 360/51; 375/373–376, 371

[56] References Cited

U.S. PATENT DOCUMENTS

| | | | |
|---|---|---|---|
| 4,470,025 | 9/1984 | Baker | 331/4 X |
| 4,614,917 | 9/1986 | Zelitzki et al. | 331/DIG. 2 X |
| 5,382,921 | 1/1995 | Estrada et al. | 331/25 X |
| 5,406,592 | 4/1995 | Baumert | 327/159 X |
| 5,459,435 | 10/1995 | Taki | 327/155 X |

Primary Examiner—David Mis
Attorney, Agent, or Firm—Nikaido, Marmelstein, Murray & Oram LLP

[57] ABSTRACT

An automatic adjustment circuit for an oscillator converts an output from a register into an analog signal by means of a D/A converter. An oscillation frequency of an oscillator is controlled by an output of the D/A converter. A first counter for counting an oscillation signal of the oscillator 1 resets itself and generates a pulse when a count reaches a predetermined value. A second counter counts a reference frequency pulse having a frequency substantially higher than the oscillation frequency of the oscillator. The second counter, on completion of counting a given preset value, changes an output level. The second counter is preset by said first counter when the first counter resets itself. Outputs from the first and the second counters are processed by an AND operation in an AND circuit. A third counter counts an output from the AND circuit, and provides a count output to the register.

6 Claims, 6 Drawing Sheets

AUTOMATIC ADJUSTMENT CIRCUIT FOR AN OSCILLATOR

BACKGROUND OF THE INVENTION

1. Field of the Invention

The present invention relates to an automatic adjustment circuit for automatically adjusting a central frequency of an oscillator.

2. Description of the Prior Art

For example, a voltage controlled oscillator (hereinafter referred to as VCO), which is used in various electronic appliances, is often formed with its central frequency shifted from a predetermined value, because of variations in characteristics of individual circuit elements. It has therefore been customary to cope with such a shift by controlling a constant of a capacitor or a coil, or by manipulating a potentiometer.

However, this is far from eliminating manual adjustments and, accordingly, it does not lead to efficient production. Moreover, in the case where an oscillator has to be integrated in an IC in order to reduce the number of externally mounted parts, it is not feasible to adjust oscillation frequency by controlling a constant of a coil, because some circuit elements such as a coil cannot be connected to an IC.

On the other hand, there are electronic appliances in which exact adjustment of a central frequency of an oscillator is essential. For example, a hi-fi VHS-format VCR (videocassette recorder) is counted as such. A VCR of this type requires two carriers for recording and reproducing a sound signal in each of different television systems, that is, 1.3 MHz and 1.7 MHz in the NTSC system, 1.4 MHz and 1.8 MHz in the PAL system, and so on. When these two carriers are modulated with a sound signal, each of them will have an extension of ±150 kHZ at the maximum, leaving a margin of only 100 kHz between the two FM signals. In addition, there exist a luminance signal and a chrominance signal in the frequency bands just above and below that for a sound signal, and consequently, there remains only a range of about 10 kHz as a permissible range for a deviation of the sound signal carrier. In this case, it is unrealizably difficult to adjust a control input voltage to a VCO by manipulation of a potentiometer by a production worker.

Conventionally, a circuit as shown in FIG. 1 has been proposed for automatic adjustment of an oscillator. Such a conventional circuit is found in a hi-fi sound circuit in a 8-mm format VCR, for example. This circuit is constructed as a PLL (Phase Locked Loop) circuit. An output of a current controlled oscillator (CCO) 90 is divided by a frequency divider 91 and delivered to a phase comparator 94. The phase comparator compares phases between this signal and a reference frequency, which is separately fed in from a terminal 92 and divided by a frequency divider 93. The comparison output is smoothed by a low-pass filter 95, converted into a current by a voltage/current converter 96, amplified by a current amplifier 97, and then supplied as a control signal to the CCO 90. In the drawing, fo represents a signal oscillated by the CCO.

However, the conventional circuit is defective in the following respects. A reference frequency $f_{sc}$ is required always to be inputted. Since the circuit may synchronize with noises if it receives any, it necessitates a provision for preventing noises. Moreover, it consumes power to keep a PLL constantly in action. Further, being an analog circuit, it requires a large circuit scale. In addition, if there is more than one oscillator, each oscillator has to be provided with a PLL circuit, because one PLL circuit can control only one oscillator.

SUMMARY OF THE INVENTION

An object of the present invention is to provide a small-scale, less power-consuming circuit for automatically adjusting a frequency of an oscillator.

An automatic oscillation frequency adjustment circuit of the present invention is provided with a register, a D/A converter for converting an output from said register into an analog signal, an oscillator whose oscillation frequency is controlled by an output from said D/A converter, a first counter for counting a signal oscillated by said oscillator, which resets itself and generates a pulse when a count result reaches a predetermined value, a second counter for counting a reference frequency pulse having a frequency higher than an oscillation frequency of said oscillator, which changes an output voltage level when counting of a given preset value is completed, and which is preset by said first counter when the first counter resets itself, an AND circuit for performing an AND operation between outputs from said first and second counters, and a third counter for counting an output from said AND circuit, which gives a count output to the register.

The oscillator starts oscillating at a low frequency at first. Therefore, the first counter takes much time to reach a predetermined value, while the second counter for counting a reference frequency pulse takes less time to complete a counting of a preset value. Thus, a level transition in an output of the second counter occurs first, and a pulse generation by the first counter follows thereafter. As a result, a pulse is generated by the AND circuit. This pulse increments an output of the third counter, thereby raising a control voltage originating from the register and supplied through the D/A converter to the oscillator. Consequently, the oscillation frequency rises. As the oscillation frequency rises, the first counter takes less time in reaching a predetermined value, the timing of an output pulse generation by the first counter accordingly approaching that of a level transition by the second counter. This sequence is repeated until the oscillation circuit reaches a predetermined value (a frequency that corresponds to a preset value). At this time, an output pulse generation by the first counter occurs earlier than a level shift by the second counter and no output is obtained from the AND circuit. Consequently, the third counter stops incrementing, stabilizing the frequency of the oscillator. This stabilized frequency is the desired oscillation frequency.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 2:
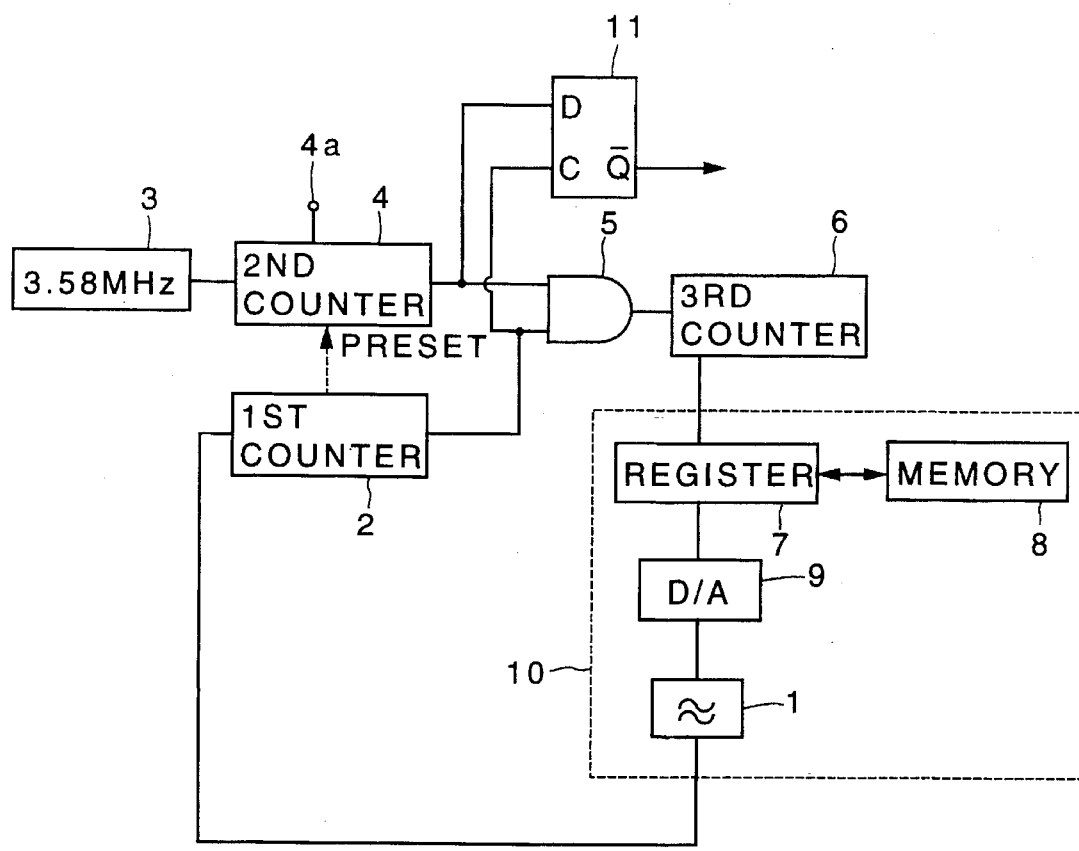
FIG. 2 is a block diagram of an automatic adjustment circuit for an oscillator embodying the present invention.

An embodiment of the present invention is described below. In FIG. 2, reference numeral 1 represents a voltage controlled oscillator, reference numeral 2 represents a first counter for counting an output of the voltage controlled oscillator 1, which resets itself and generates a pulse when the count reaches a predetermined value, reference numeral 3 represents a reference frequency oscillator for generating a pulse of 3.58 MHz, and reference numeral 4 represents a second counter for dividing the reference frequency. The second counter 4 receives a preset value through a terminal 4a. The second counter 4 is preset by a preset signal given from the first counter 2 when the first counter 2 resets itself.

Reference numeral 5 represents an AND circuit constituting a phase comparator for comparing phases of outputs from the first and second counters 2 and 4. Reference numeral 6 represents a third counter for counting pulses outputted from the AND circuit 5. Reference numeral 7 represents a register for temporarily storing an output from the third counter 6. Reference numeral 8 represents a memory for storing contents of the register 7 and for providing stored data to the register 7. Reference numeral 9 is a D/A converter for converting an output from the register 7 into an analog signal and for feeding the signal to the voltage controlled oscillator 1 as a control signal.

Figure 3:
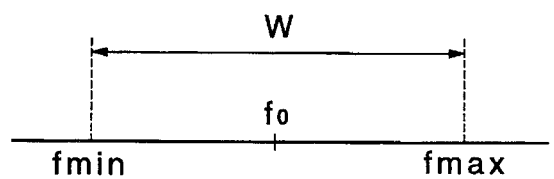
FIG. 3 is a diagram showing a draw-in frequency range of an oscillator to be adjusted by the present circuit.

Next, the working of an automatic adjustment circuit for an oscillator as shown FIG. 2 will be described below. The voltage controlled oscillator 1 has a draw-in range relative to a required central frequency fo, as shown in FIG. 3. An initial value of the output from the third counter 6 is 0, and therefore, the value originating from the register 7 and supplied through the D/A converter 9 to the voltage controlled oscillator is 0 of a gradation ranging from 0 to 256. Assume this 0 corresponds to the minimum frequency fmin in the draw-in range W.

Accordingly, the voltage controlled oscillator 1 oscillates at a frequency fmin at the beginning, and this oscillation frequency is counted by the first counter 2. On the other hand, the second counter 4 starts counting the 3.58 MHz reference frequency. Assume a preset value A corresponding to the central frequency of the oscillator 1 has been preset in the second counter 4 through a terminal 4a.

Figure 4:
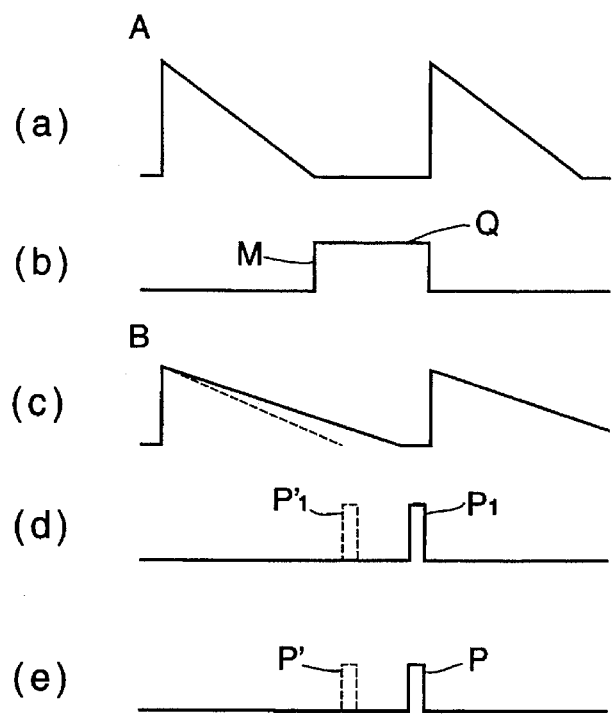
FIG. 4 is a operational diagram in connection with FIG. 2.

A counting operation of the second counter 4 is conceptually shown in (a) of FIG. 4. The reference frequency (3.58 MHz) is decremented from the preset value A until the count reaches 0. When the count reaches 0, the output level of the second counter 4 is turned from low to high as shown in (b) of FIG. 4.

On the other hand, the first counter 2 decrements the oscillation frequency of the voltage controlled oscillator 1 from a reset value. Since the oscillation frequency of the voltage controlled oscillator (1.3 MHz, for example) is lower than the reference frequency (3.58 MHz), the first counter 2 takes more time in reaching 0 than the second counter 4 takes in reaching 0. A counting operation of the first counter 2 is conceptually shown in (c) of FIG. 4. The first counter 2, when the count reaches 0, generates a pulse $P_1$ as shown in (d) of FIG. 4, and at the same time resets itself, thereby automatically returning to the reset value B.

The above-mentioned pulse $P_1$ is applied to the second counter 4 to preset the second counter 4. Thus, the second counter 4 returns to the preset value A. As a result of presetting, the second counter 4 turns the output level low.

The output pulse $P_1$ from the first counter 2, shown in (d) of FIG. 4, and the output pulse Q from the second counter 4, shown in (b) of FIG. 4, are processed by an AND operation in the AND circuit 5, and the AND circuit 5 then generates a pulse P as shown in (e) of FIG. 4. The third counter 6, on receiving a pulse P, increments its output by one. An output from the third counter 6 is given in an 8-bit format, though this is not to suggest a limitative use of this particular format. The output, after being stored temporarily in the register 7 and then converted into an analog signal by the D/A converter 9, is applied to the voltage controlled oscillator 1, thereby causing the voltage controlled oscillator 1 to raise the oscillation frequency one step.

As a result, since the first counter 2 counts a frequency higher than that at the beginning, it takes less time in reaching 0, as shown by a broken line in (c) of FIG. 4. This time, the output pulse $P_1'$ from the first counter 2 is generated at a position shifted leftward from $P_1$. Likewise, the output pulse P' from the AND circuit 5 is shifted leftward from P. Since the third counter 6, on receiving P', further increments its output by one, the oscillator 1 raise the oscillation frequency one step further.

If the above sequence is repeated, a pulse generated by the first counter 2 shifts more and more leftward until it at last shifts beyond the rising edge M of an output pulse Q from the second counter 4, as shown in (b) of FIG. 4. Under this condition, the AND circuit 5 no more generates an output pulse, and therefore, the third counter 6 stops counting, stabilizing an output from the register 7.

Thus, the frequency of the oscillator 1 is stabilized. The frequency of the oscillator at this time is the desired frequency cy fo, because, when the above-mentioned frequency comes to be stabilized, both the first and the second counters 2 and 4 are reset at a point M, which corresponds to a frequency fo. Incidentally, according as the above-mentioned pulse $P_1'$ moves leftward, the falling edge of an output pulse Q from the second counter 4, shown in (b) of FIG. 4, moves leftward likewise. The width of the output pulse Q thus becomes narrower and narrower until the pulse disappears.

Figure 5:
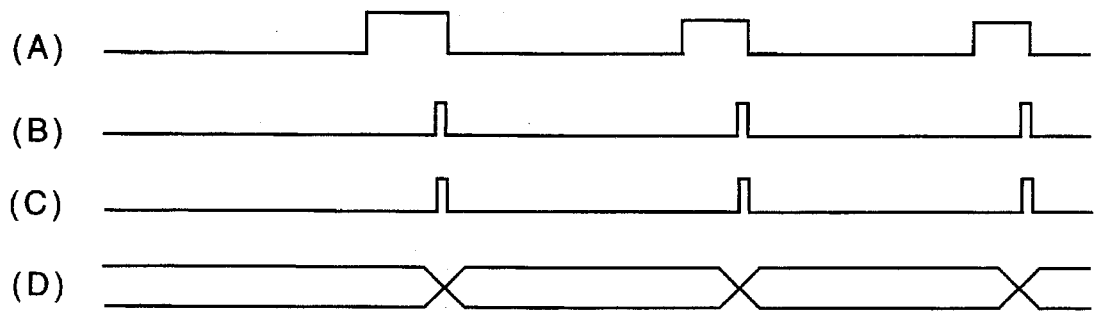
FIG. 5 is a operational diagram in connection with FIG. 2.
Figure 6:
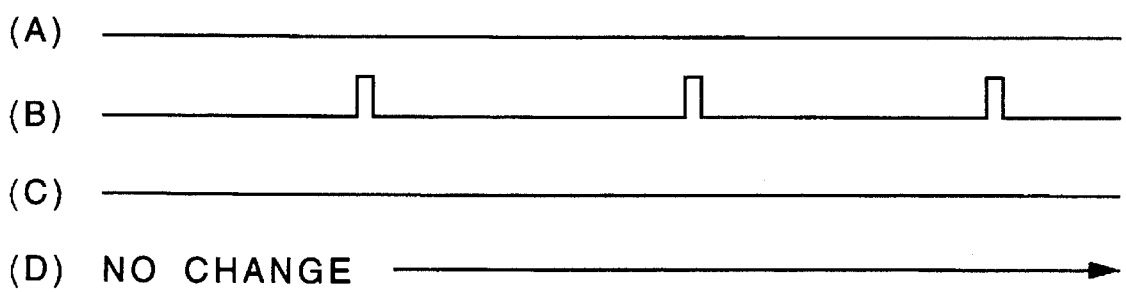
FIG. 6 is a operational diagram in connection with FIG. 2.

FIG. 5 is a time chart showing the operation in the case where the frequency of the oscillator 1 is lower than the target value fo. FIG. 6 is a time chart showing the operation in the case where the frequency of the oscillator 1 is higher than the target value fo. In FIGS. 5 and 6, (A) represents an output from the second counter 4, (B) represents an output from the first counter 2, (C) represents an input to the third counter 6, and (D) represents an output from the third counter 6.

It is desirable to indicate in some way the completion of adjustment of frequency to fo. Reference numeral 11 represents a D flip-flop for generating a display signal for that purpose, where a clock terminal c is fed with an output of the first counter 2, a terminal D is fed with an output of the second counter 4, and a terminal −Q delivers an output. The level of the terminal −Q remains low, until it turns high when the oscillation frequency reaches fo. Accordingly, by applying an output appearing at the −Q terminal to a display element (not shown in the drawing), it is possible to indicate the adjustment completion signal.

Figure 1:
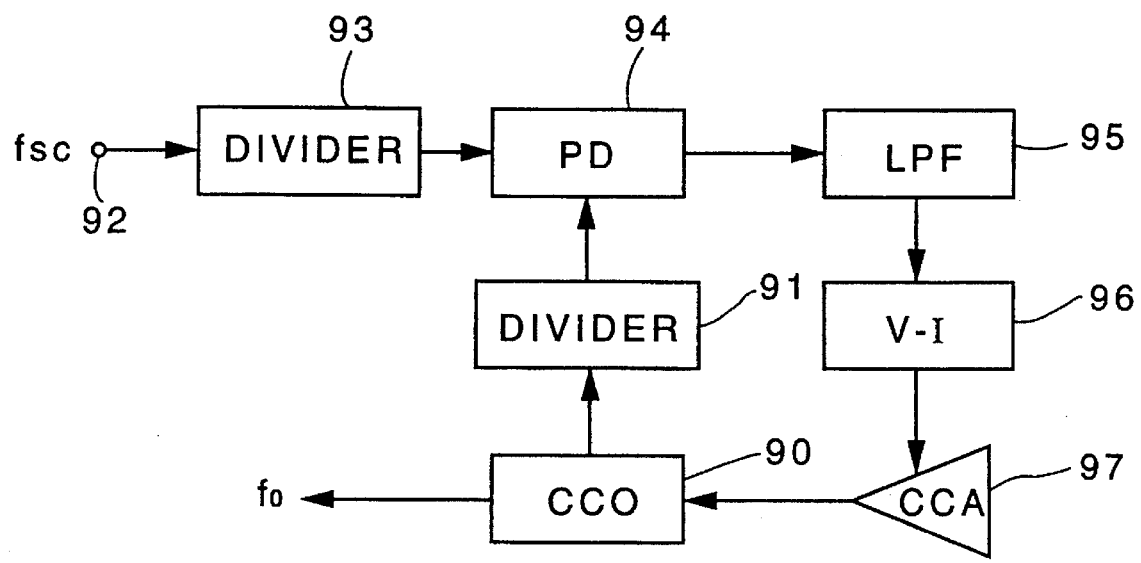
FIG. 1 is a block diagram of a conventional automatic adjustment circuit for an oscillator.

It is possible to incorporate in an apparatus including an oscillator 1 a group 10 comprising said oscillator 1, a register 7, a memory 8, and a D/A converter 9, while other components of FIG. 1 are provided in an automatic adjustment apparatus. In such a case, if a nonvolatile memory such as an EEPROM, which is capable of retaining adjustment data without a supply of backup power, is used as the memory 8, the oscillator 1 can be conveniently set to a required central frequency according to data stored in the memory 8 at any time when the oscillator is in operation (in actual use). It is needless to say that components other than said group 10 may be incorporated in the apparatus itself that includes an oscillator.

Figure 7:
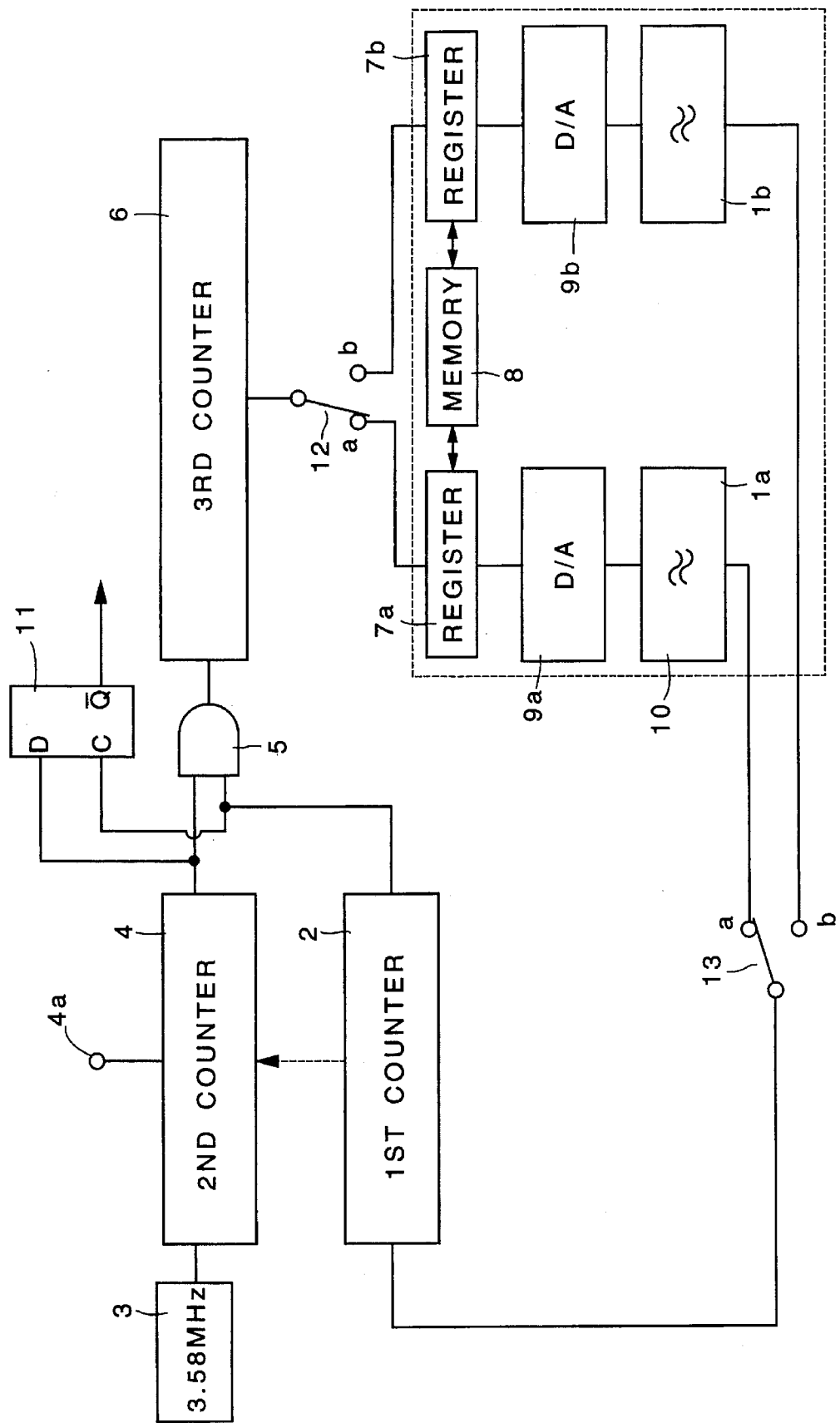
FIG. 7 is a block diagram showing a second embodiment of the present invention.

Next, FIG. 7 shows an embodiment that is capable of automatically controlling two voltage controlled oscillators 1a and 1b. There, the group 10 is provided with switches 12 and 13 at its input and output ends. In the group 10, registers 7a and 7b, and D/A converters 9a and 9b are individually provided. The memory 8 is common to both registers 7a and 7b.

Figure 8:
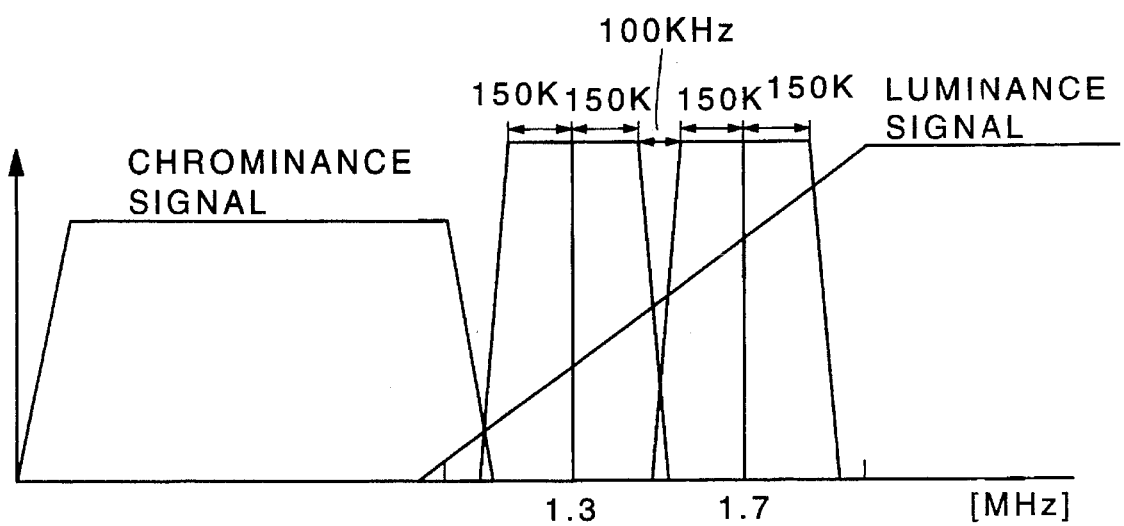
FIG. 8 is a diagram showing a spectrum of recording signals of a hi-fi VHS-format VCR, as an example of an oscillator to be adjusted by an automatic adjustment circuit of the present invention.
Figure 9:
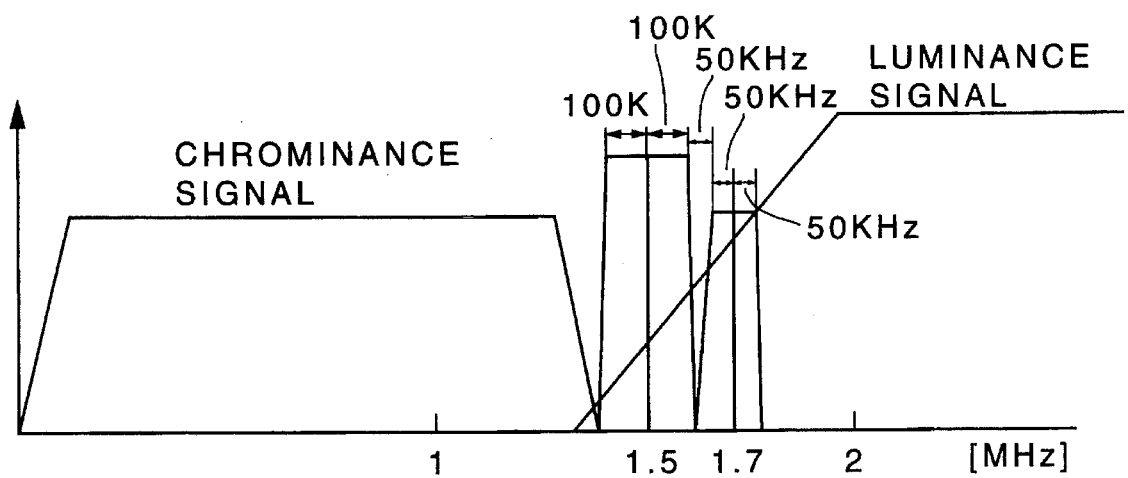
FIG. 9 is a diagram showing a spectrum of recording signals of a hi-fi 8-mm format VCR, as an example of an oscillator to be adjusted by an automatic adjustment circuit of the present invention.

The switches 12 and 13 are switched to the terminal a position when the oscillator 1a is adjusted, and they are switched to the terminal b position when the oscillator 1b is adjusted. Depending on whether the switches 12 and 13 are in the terminal a position or in the terminal b position, the second counter 4 is preset to 1.3 MHz or to 1.7 MHz. Oscillators 1a and 1b are used, for example, in a hi-fi VHS-format VCR as mentioned above. In this case, the central frequency of the oscillator 1a is 1.3 MHz, and the central frequency of the oscillator 1b is 1.7 MHz. Alternatively, the oscillators 1a and 1b may be used in a hi-fi 8-mm format VCR. FIG. 8 shows a spectrum of a hi-fi recording signals of a VHS-format VCR. FIG. 9 shows a spectrum of a hi-fi recording signals of an 8-mm VCR.

According to the present invention, since adjustment is performed automatically, it is possible to reduce costs in a production line. Moreover, it is possible to adjust oscillators of various frequencies by simply changing preset values in a second counter. Further, since an adjustment circuit is mostly composed of digital circuits, it is possible to integrate it into a CMOS-IC, thereby downsizing the adjustment circuit and reducing costs. In addition, since operation of an adjustment circuit can be stopped by storing an adjustment value in a register, it is possible to suppress digital noises and to reduce power consumption.

What is claimed is:

1. An automatic adjustment circuit for an oscillator, comprising:

a register;

a D/A converter for converting an output from said register into an analog signal;

an oscillator whose oscillation frequency is controlled by an output from said D/A converter;

a first counter for counting the oscillation frequency of said oscillator, which resets itself and generates a pulse when a count result reaches a predetermined value;

a second counter for counting a reference frequency pulse having a frequency higher than the oscillation frequency of said oscillator, which changes an output voltage level when counting of a given preset value is completed, and which is preset by said first counter when the first counter resets itself;

an AND circuit for performing an AND operation between outputs from said first and second counters; and a third counter for counting an output from said AND circuit and for providing a count output to the register.

2. An automatic adjustment circuit for an oscillator as claimed in claim 1, which has a plurality of groups comprising said register, said D/A converter and said oscillator, further comprising:

first switching means for alternatively giving an oscillation signal of one of these groups to said first counter; and second switching means for providing an output from said third counter to a register of a group selected by said first switching means, wherein said second counter is selectively presettable to a preset value corresponding to each of said groups.

3. An automatic adjustment circuit for an oscillator as claimed in claim 1, wherein said register, said D/A converter and said oscillator are formed in a single IC chip, said IC chip incorporating a memory capable of retaining a value of said register after power-down.

4. An automatic adjustment circuit for an oscillator as claimed in claim 1, provided with a displaying means driven by an output of said first or second counter for displaying completion of automatic adjustment.

5. An automatic adjustment circuit for an oscillator as claimed in claim 1, wherein said register, said D/A converter, said oscillator, said first counter, said second counter and said third counter are formed in a single IC chip, and wherein readjustment is performed at power-on.

6. An automatic adjustment circuit for an oscillator as claimed in claim 1, wherein said register, said D/A converter and said oscillator are incorporated in a product, while said first counter, said second counter, said third counter and said AND circuit are provided in equipment for manufacturing the product.

\* \* \* \* \*